US008564763B2

(12) United States Patent
Jacobs et al.

(10) Patent No.: US 8,564,763 B2
(45) Date of Patent: Oct. 22, 2013

(54) LITHOGRAPHIC APPARATUS AND METHOD (75) Inventors: Johannes Henricus Wilhelmus Jacobs, Eindhoven (NL); Martinus Hendrikus Antonius Leenders, Rhoon (NL); Frits Van der Meulen, Eindhoven (NL); Joost Jeroen Ottens, Veldhoven (NL); Anko Jozef Cornelus Sijben, Uden (NL); Wouterus Johannes Petrus Maria Maas, Boxtel (NL); Hendrikus Johannes Marinus Van Abeelen, Moergestel (NL); Henricus Petrus Versteijnen, Hilvarenbeek (NL); Paula Steffens, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 843 days.

(21) Appl. No.: 12/436,635

(22) Filed: May 6, 2009

(65) Prior Publication Data

US 2009/0279061 A1 Nov. 12, 2009

Related U.S. Application Data (60) Provisional application No. 61/071,623, filed on May 8, 2008, provisional application No. 61/193,129, filed on Oct. 30, 2008.

(51) Int. Cl.
*G03B 27/52* (2006.01)
*G03B 27/58* (2006.01)

(52) U.S. Cl.
USPC .............................................. 355/72; 355/30

(58) Field of Classification Search
USPC ...................................................... 355/72, 30
See application file for complete search history.

(56) References Cited

U.S. PATENT DOCUMENTS

| 4,503,335 | A | 3/1985 | Takahashi |
| 4,509,852 | A | 4/1985 | Tabarelli et al. |
| 6,072,162 | A * | 6/2000 | Ito et al. ...................... 219/444.1 |
| 7,304,715 | B2 | 12/2007 | Cadee et al. |
| 7,505,115 | B2 * | 3/2009 | Magome et al. ................ 355/53 |
| 7,580,109 | B2 * | 8/2009 | Akaike ........................... 355/30 |
| 7,649,611 | B2 | 1/2010 | Zaal et al. |
| 7,791,709 | B2 * | 9/2010 | Hennus et al. .................. 355/72 |
| 2002/0002944 | A1 * | 1/2002 | Shirley ........................... 118/666 |
| 2004/0136494 | A1 | 7/2004 | Lof et al. |
| 2004/0207824 | A1 | 10/2004 | Lof et al. |

(Continued)

FOREIGN PATENT DOCUMENTS

| EP | 1420300 A2 | 5/2004 |
| JP | 2000-031017 | 1/2000 |

(Continued)

OTHER PUBLICATIONS

Japanese Office Action mailed Aug. 24, 2011 in corresponding Japanese Patent Application No. 2009-111986.

*Primary Examiner* — Thomas R Artman
(74) *Attorney, Agent, or Firm* — Pillsbury Winthrop Shaw Pittman LLP (57) ABSTRACT A substrate table is disclosed in which heaters are provided to account for a heat load which may be applied to the substrate. The heaters are grouped in segments to improve control. A temperature sensor per segment may be provided. The temperature sensor may be embedded in the substrate table.

20 Claims, 6 Drawing Sheets

(56) References Cited

U.S. PATENT DOCUMENTS

| | | | |
|---|---|---|---|
| 2005/0094125 A1* | 5/2005 | Arai | 355/72 |
| 2005/0146694 A1 | 7/2005 | Tokita | |
| 2006/0033892 A1* | 2/2006 | Cadee et al. | 355/30 |
| 2006/0038968 A1 | 2/2006 | Kemper et al. | |
| 2006/0119809 A1 | 6/2006 | Verhagen et al. | |
| 2006/0146305 A1* | 7/2006 | Magome et al. | 355/53 |
| 2006/0158627 A1 | 7/2006 | Kemper et al. | |
| 2006/0266286 A1* | 11/2006 | Kasuga | 118/666 |
| 2006/0274298 A1* | 12/2006 | Akaike | 355/72 |
| 2006/0285093 A1 | 12/2006 | Hara et al. | |
| 2007/0153244 A1 | 7/2007 | Maria Zaal et al. | |
| 2008/0011737 A1 | 1/2008 | Fukuoka et al. | |
| 2008/0137055 A1* | 6/2008 | Hennus et al. | 355/72 |
| 2008/0297744 A1 | 12/2008 | Hennus et al. | |
| 2009/0279061 A1* | 11/2009 | Jacobs et al. | 355/30 |
| 2009/0296068 A1* | 12/2009 | Castelijns et al. | 355/72 |

FOREIGN PATENT DOCUMENTS

| | | |
|---|---|---|
| JP | 2002-326893 | 11/2002 |
| JP | 2002-353110 | 12/2002 |
| JP | 2004-031631 | 1/2004 |
| JP | 2006-054468 | 2/2006 |
| JP | 2006-127883 | 5/2006 |
| JP | 2006-173185 | 6/2006 |
| JP | 2007-194618 | 8/2007 |
| WO | 99/49504 A1 | 9/1999 |
| WO | 2005/064405 A2 | 7/2005 |

* cited by examiner

LITHOGRAPHIC APPARATUS AND METHOD

This application claims priority and benefit under 35 U.S.C. §119(e) to U.S. Provisional Patent Application No. 61/071,623, entitled "LITHOGRAPHIC APPARATUS AND METHOD", filed on May 8, 2008, and to U.S. Provisional Patent Application No. 61/193,129, entitled "LITHOGRAPHIC APPARATUS AND METHOD", filed on Oct. 30, 2008. The content of each of the foregoing applications is incorporated herein in its entirety by reference.

FIELD

The present invention relates to a lithographic apparatus and a method of compensating for local heat load variations.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Figure 2:
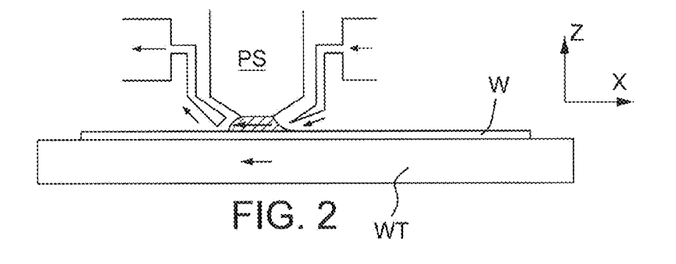
FIGS. 2 and 3 depict a liquid supply system for use in a lithographic projection apparatus.
Figure 3:
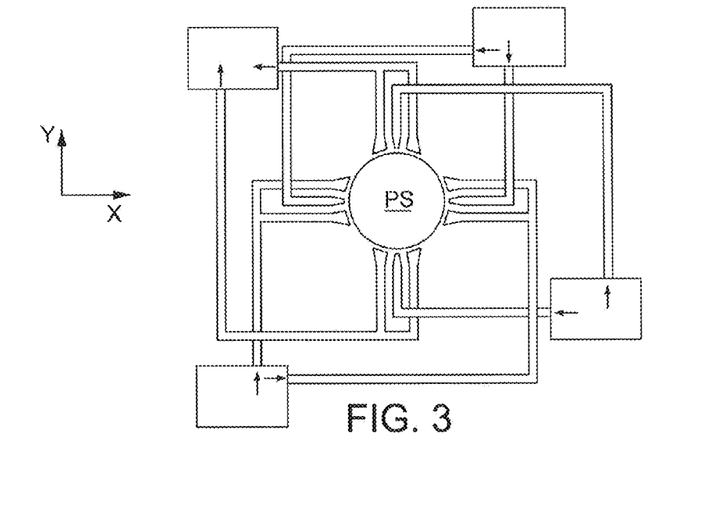

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate W, preferably along the direction of movement of the substrate W relative to the final element, and is removed by at least one outlet after having passed under the projection system PS. That is, as the substrate W is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that arrows in FIGS. 2 and 3 show liquid flow.

Figure 4:
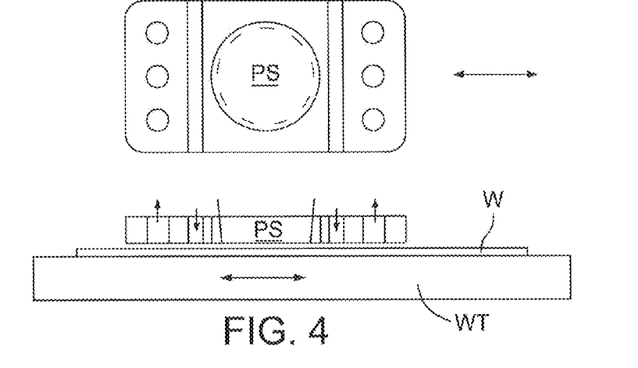
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that arrows in FIG. 4 show liquid flow.

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

SUMMARY

A substrate is normally positioned in a recess within the substrate table. In order to account for variations in the width (e.g., diameter) of the substrate, the recess is usually made a little larger than the maximum likely size of the substrate. Therefore there exists a gap between the edge of the substrate and the substrate table. With all arrangements for providing liquid, there may be a difficulty in the treatment of the gap between the substrate and the substrate table. This is because liquid can enter this gap. It is desirable to remove liquid from the gap to prevent it from working its way under the substrate. It is also desirable to prevent bubbles of gas entering the immersion liquid from the gap. For this purpose an inlet may be provided below the gap between the edge of the substrate and substrate table. The inlet is connected to an underpressure source so that liquid and/or gas can be removed from the gap. If gas is removed through the gap then this may lead to undesirable evaporation of any liquid in the gap. This can in turn lead to localized cooling. Localized cooling is undesirable because it may lead to thermal contraction of the substrate table and thereby to possible overlay errors.

It is desirable, for example, to provide an apparatus in which the occurrence of thermal expansion/contraction effects are reduced. In particular it is desirable to provide a system configured to reduce thermal expansion/contraction effects in an immersion system which uses a supply system which provides immersion fluid to a localized area of the substrate and/or substrate table.

According to an aspect of the invention, there is provided an immersion lithographic projection apparatus comprising a substrate table for supporting a substrate on a substrate supporting area, the substrate table comprising a plurality of heaters, at least two of the plurality of heaters being positioned in a non-parallel way adjacent different portions of an edge of the substrate supporting area and being independently controllable of one another.

According to an aspect of the invention, there is provided a lithographic projection apparatus comprising a substrate table for supporting a substrate on a substrate supporting area, an inlet in the substrate table, the inlet surrounding the substrate supporting area, and a plurality of heaters positioned adjacent to an edge of the inlet, wherein at least two of the plurality of heaters are positioned along different segments of the inlet.

According to an aspect of the invention, there is provided a method of compensating for a local heat load in an immersion lithographic projection apparatus comprising a substrate table for supporting a substrate on a substrate supporting area, the method comprising controlling a plurality of independently controlled non-parallel heaters adjacent different portions of an edge of the substrate supporting area to compensate for a local heat load.

According to an aspect of the invention, there is provided a method of compensating for a local heat load variation in an inlet which surrounds a substrate supporting area of a substrate table of a lithographic apparatus, the method comprising controlling power to each of a plurality of heaters positioned adjacent an edge of the inlet, wherein at least two of the plurality of heaters are positioned along different segments of the inlet, to compensate for a local variation in temperature.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
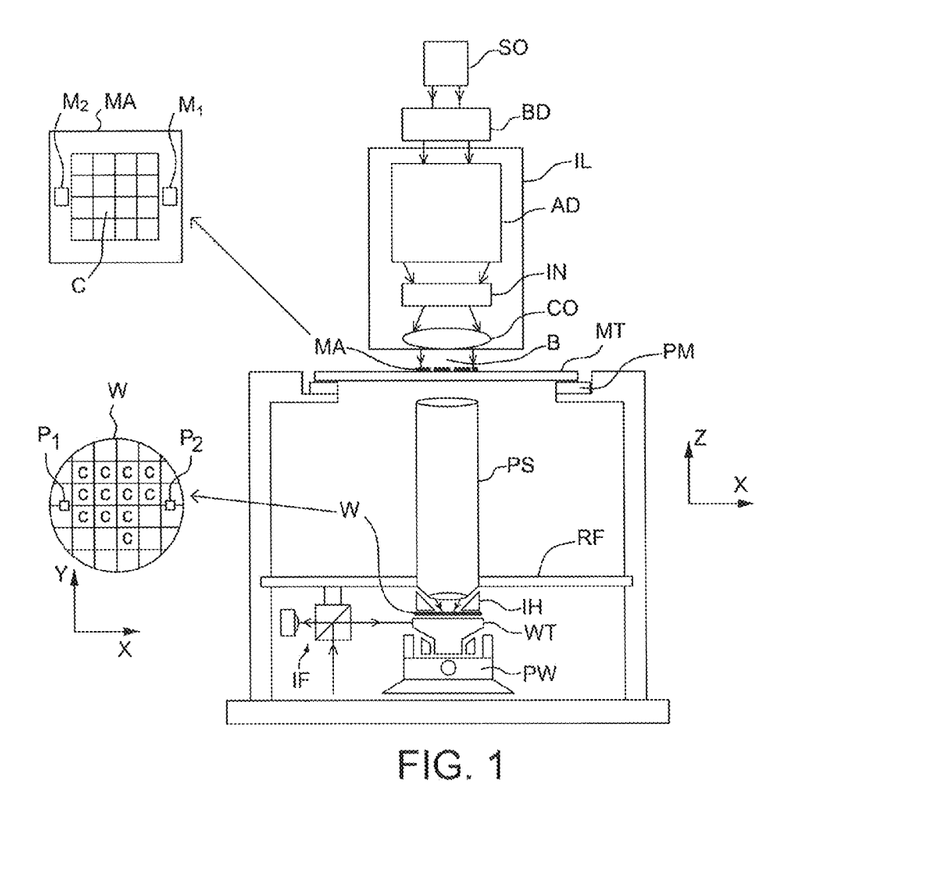
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
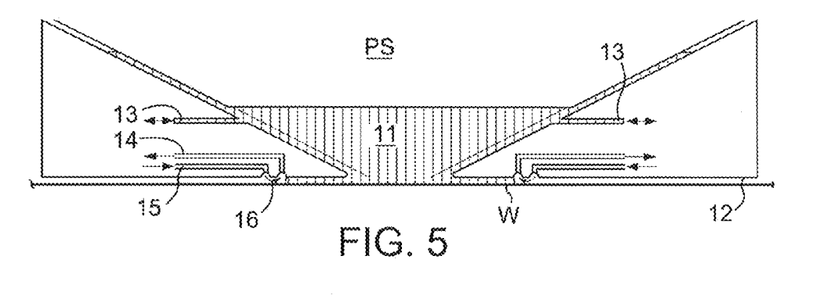
FIG. 5 depicts, in cross-section, a fluid confinement structure which may be used in an embodiment of the present invention as a liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid confinement structure 12, IH. The fluid confinement structure 12 extends along at least a part of a boundary of the space 11 between the final element of the projection system PS and the substrate table WT or substrate W. (Please note that reference in the following text to surface of the substrate W also refers in addition or in the alternative to a surface of the substrate table W, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a fluid seal, desirably a gas seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

In an embodiment, the liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Other arrangements are possible and, as will be clear from the description below, an embodiment of the present invention may use any type of localized liquid supply system. An embodiment of the invention is particularly relevant to use with any localized liquid supply systems as the liquid supply system.

Figure 6:
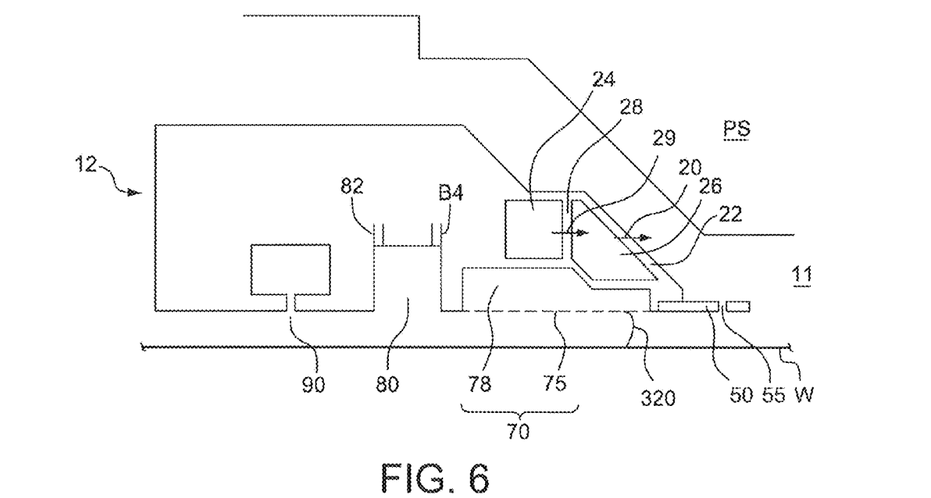
FIG. 6 illustrates, in cross-section, another fluid confinement structure which may be used in an embodiment of the present invention.

FIG. 6 illustrates a fluid confinement structure 12 which is part of a liquid supply system. The fluid confinement structure 12 extends around the periphery (e.g., circumference) of the final element of the projection system PS such that the fluid confinement structure 12 (which is sometimes called a seal member) is, for example, substantially annular in overall shape. The projection system PS may not be circular and the outer edge of the fluid confinement structure 12 may also not be circular so that it is not necessary for the fluid confinement structure 12 to be ring shaped. The fluid confinement structure 12 could also be other shapes so long as it has an opening through which the projection beam may pass out from the final element of the projection system PS. The opening may be centrally located. Thus, during exposure, the projection beam may pass through liquid contained in the opening of the fluid confinement structure 12 and onto the substrate W. The fluid confinement structure 12 may be, for example, substantially rectangular and may not be necessarily the same shape as the final element of the projection system PS is at the height of the fluid confinement structure 12.

The function of the fluid confinement structure 12 is at least partly to maintain or confine liquid in the space 11 between the projection system PS and the substrate W so that the projection beam may pass through the liquid. The top level of liquid is simply contained by the presence of the fluid confinement structure 12. The level of liquid in the space 11 is maintained such that the liquid does not overflow over the top of the fluid confinement structure 12.

The immersion liquid is provided to the space 11 by the fluid confinement structure 12 (thus the fluid confinement structure 12 may be considered to be a fluid handling structure). A passageway or flow path for immersion liquid passes through the fluid confinement structure 12. Part of the flow path is comprised by a chamber 26. The chamber 26 has two side walls 28, 22. Liquid passes through the first side wall 28 into chamber 26 from chamber or outlet 24 and then through the second side wall 22 into the space 11. A plurality of outlets 20 provide the liquid to the space 11. The liquid passes through holes 29, 20 in side walls 28, 22 respectively prior to entering the space 11. The location of the through holes 20, 29 may be random.

A seal is provided between the bottom of the fluid confinement structure 12 and the substrate W. In FIG. 6 a seal device is configured to provide a contactless seal and is made up of several components. Radially outwardly from the optical axis of the projection system PS, there is provided a (optional) flow control plate 50 which extends into the space 11 (though not into the path of the projection beam) which helps maintain substantially parallel flow of the immersion liquid out of outlet 20 across the space 11. The flow control plate 50 has through holes 55 in it to reduce the resistance to movement in the direction of the optical axis of the fluid confinement structure 12 relative to the projection system PS and/or substrate W.

Radially outwardly of the flow control plate 50 on the bottom surface of the fluid confinement structure 12 may be an extractor assembly 70 to extract liquid from between the fluid confinement structure 12 and the substrate W and/or the substrate table WT. The extractor assembly 70 will be described in more detail below and forms part of the contactless seal which is created between the fluid confinement structure 12 and the substrate W. The extractor assembly 70 may operate as a single phase or as a dual phase extractor.

Radially outwardly of the extractor assembly 70 may be a recess 80. The recess is connected through an inlet 82 to the atmosphere. The recess 80 is connected via an outlet 84 to a low pressure source. The inlet 82 may be radially outwardly positioned with respect to the outlet 84. Radially outwardly of the recess 80 may be a gas knife 90. An arrangement of the extractor assembly, recess and gas knife is disclosed in detail in United States patent application publication no. US 2006/0158627. However, in that document the arrangement of the extractor assembly is different.

The extractor assembly 70 comprises a liquid removal device or extractor or inlet such as the one disclosed in United States patent application publication no. US 2006-0038968. Any type of liquid extractor may be used. In an embodiment, the extractor assembly 70 comprises an inlet which is covered in a porous material 75 which is used to separate liquid from gas to enable single-liquid phase liquid extraction. A chamber 78 downstream of the porous material 75 is maintained at a slight under pressure and is filled with liquid. The under pressure in the chamber 78 is such that the meniscuses formed in the holes of the porous material 75 prevent ambient gas from being drawn into the chamber 78 of the extractor assembly 70. However, when the surface of the porous material 75 comes into contact with liquid there is no meniscus to restrict flow and the liquid can flow freely into the chamber 78 of the extractor assembly 70. The surface of the porous material 75 extends radially inwardly along the fluid confinement structure 12 (as well as around the space 11). The rate of extraction through the surface of the porous material 75 varies according to how much of the porous material 75 is covered by liquid.

The porous material 75 has a large number of small holes each with a dimension, e.g. a width, such as a diameter, $d_{hole}$ in the range of 5 to 50 μm. The porous material 75 may be maintained at a height in the range of 50 to 300 μm above a surface from which liquid is to be removed, e.g. the surface of a substrate W. In an embodiment, porous material 75 is at least slightly hydrophilic, i.e. having a contact angle of less than 90°, desirably less than 85° or desirably less than 80°, to the immersion liquid, e.g. water.

It may not always be possible to prevent gas being drawn into the extractor assembly 70 but the porous material 75 will prevent large uneven flows that may cause vibration. Microsieves made by electroforming, photoetching and/or laser cutting can be used as the porous material 75. Suitable sieves are made by Stork Veco B.V., of Eerbeek, the Netherlands. Other porous plates or solid blocks of porous material may also be used, provided the pore size is suitable to maintain a meniscus with the pressure differential that will be experienced in use.

During use (e.g., during the time that the substrate W moves under the fluid confinement structure 12 and projection system PS), a meniscus 320 extending between the substrate W and the fluid confinement structure 12 is provided.

Although not specifically illustrated in FIG. 6, the liquid supply system has an arrangement to deal with variations in the level of the liquid. This is so that liquid which builds up between the projection system PS and the fluid confinement structure 12 can be dealt with and does not spill. Such a build-up of liquid might occur during relative movement of the fluid confinement structure 12 to a projection system PS described below. One way of dealing with this liquid is to provide a very large fluid confinement structure 12 so that there is hardly any pressure gradient over the periphery (e.g., circumference) of the fluid confinement structure 12 during movement of the fluid confinement structure 12 relative to the projection system PS. In an alternative or additional arrangement, liquid may be removed from the top of the fluid confinement structure 12 using, for example, an extractor such as a single phase extractor similar to the extractor 70. An alternative or additional feature is a liquidphobic or hydrophobic coating. The coating may form a band around the top of the fluid confinement structure 12 surrounding the opening and/or around the last optical element of the projection system PS. The coating may be radially outward of the optical axis of the projection system PS. The liquidphobic or hydrophobic coating helps keep the immersion liquid in the space 11.

Figure 7:
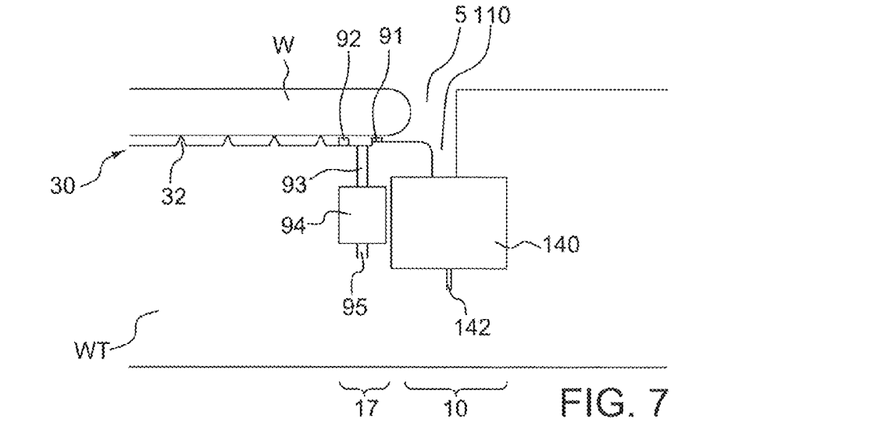
FIG. 7 illustrates, in cross-section, a portion of a substrate table surrounding the edge of a substrate.

FIG. 7 is a schematic cross-section through a substrate table WT and a substrate W. A gap 5 exists between an edge of the substrate W and an edge of the substrate table WT. The gap 5 is at an outer area or edge of a recess in which the substrate W is placed during imaging. The substrate W can be supported on a substrate supporting area of the substrate table WT. In an immersion lithography machine using a localized area liquid supply system, when the edge of the substrate W is being imaged (or at other times such as when the substrate W first moves under the projection system PS, as described above), a gap 5 between the edge of the substrate W and the edge of the substrate table WT will pass under, for example, the space 11 filled with liquid by the liquid supply system 12. This can result in liquid from the space 11 entering the gap 5. In other liquid supply systems, liquid can enter the gap 5 at any time.

In order to deal with the liquid entering that gap 5, at least one drain 10, 17 may be provided at the edge of the substrate W to remove any liquid which enters the gap 5. In the embodiment of FIG. 7, two drains 10, 17 are illustrated though there may be only one drain or there could be more than two drains. The drains 10, 17 are, for example, annular so that the whole periphery of the substrate W is surrounded.

The primary function of the first drain 10 is to prevent bubbles of gas from entering the liquid 11 of the liquid supply system 12. Any such bubbles can deleteriously affect the imaging of the substrate W. The second drain 17 may be provided to prevent any liquid which finds its way from the gap 5 to underneath the substrate W from preventing efficient release of the substrate W from the substrate table WT after imaging. As is conventional, the substrate W is held by a pimple table 30 comprising a plurality of projections 32. An underpressure applied between the substrate W and the substrate table WT by the pimple table 30 ensures that the substrate W is held firmly in place. However, if liquid gets between the substrate W and the pimple table 30, this can lead to difficulties, particularly when unloading the substrate W. The provision of the second drain 17 under the pimple table 30 reduces or eliminates problems which may occur due to liquid finding its way underneath the substrate W.

The first drain 10 removes liquid by way of an underpressure. That is, the first drain 10 is connected via outlet 142 to an underpressure source. This underpressure source effectively removes any liquid which enters the first drain 10. The under pressure source is effective to draw gas in from outside of the gap 5 above the substrate table WT through the first drain 10 and out through the outlet 142. Measures may be taken only to connect the outlet 142 to the under pressure source when there is a chance of liquid entering the gap 5.

The exact geometry of the first drain 10 is not important. Typically the first drain 10 comprises an inlet 110 which puts a chamber 140 into fluid communication with the gap 5. The chamber 140 may be annular, for example. The outlet(s) 142 is in fluid communication with the chamber 140. Other geometries may be possible, including further chambers. The chamber 140 is useful in helping to damp pressure variations and thereby reduce vibrations. The drawing of gas and/or liquid through the inlet 110 (which may be a continuous groove or a plurality of individual through holes) can lead to the evaporation of liquid which has entered the gap 5. The evaporation of liquid leads to localized cooling. Localized cooling can result in mechanical contractions of the surrounding substrate table WT which in turn may lead to overlay errors.

The second drain 17 will now be described. An outlet 95 of the second drain 17 is held at an under pressure (e.g. 0.6 bar) which is a little larger than the under pressure (e.g. 0.5 bar) of the pimple table 30. This helps ensure that there is a flow of gas from the pimple table 30 as well as from the gap 5 to the outlet 95. In an alternative embodiment, the second drain 17 can be held at an over pressure. In this case there is a flow of gas out of the outlet 95 towards the gap 5. Combined with capillary pressure this can be used to reduce or prevent immersion liquid getting into the pimple table 30.

As can be seen, two projections 91 and 92 are provided underneath the substrate W. The radially outer projection 91 is a so-called "wet seal" and is likely to have immersion liquid passing between it and the bottom surface of the substrate W. The radially inner projection 92 is a "dry seal" and substantially only gas is likely to pass between it and the substrate W.

Between the two projections 91, 92 is a channel 93 which leads to a chamber 94. The chamber 94 is in fluid communication with the outlet 95 which is connected to the under pressure source. More detail of this second drain 17 and of the first drain 10 can be found in United States Publication No. 2008-0297744 A1, Published on Dec. 4, 2008.

One way in which this phenomenon of localized cooling may be dealt with is to provide a channel for a heat transfer fluid in the substrate table WT. The temperature of the substrate table can be maintained constant in this way. Additionally, as disclosed in United States Publication No. US 2008-0137055, a further heater may be used to heat in the vicinity of the inlet. Therefore the extra thermal load which is generated at that point may be compensated for by the use of that further heater.

Figure 8:
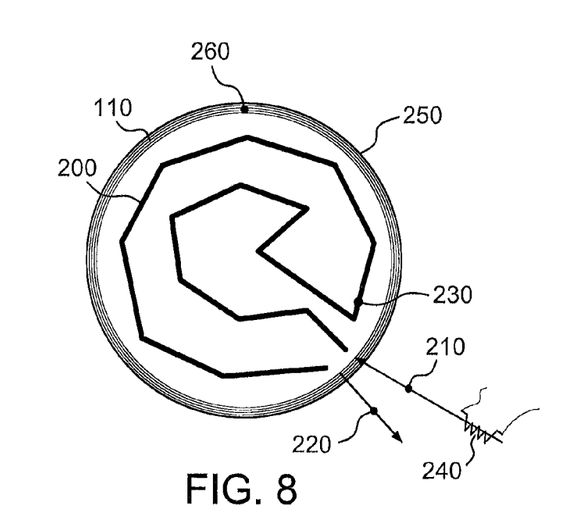
FIG. 8 illustrates, in plan, a central section of a substrate table.

FIG. 8 illustrates one such arrangement. FIG. 8 is a plan view of the substrate support area of a substrate table WT. The inlet 110 is indicated. A central channel 200 for heat transfer fluid is provided. The central channel 200 follows a path under the position of the substrate W. The path of the central channel 200 is such that an even heating can be applied by passing a heating fluid through the channel 200. The temperature of the heat transfer fluid entering the channel 200 is detected by a first temperature sensor 210. The temperature of heat transfer fluid exiting the channel 200 is detected by a second temperature sensor 220. A third temperature sensor 230 may be provided in the channel 200 to detect the temperature at a local point. A controller can be provided with data from the temperature sensors 210, 220, 230 and can control the temperature of the heat transfer fluid using a heater 240 which is used to heat transfer fluid prior to the heat transfer fluid entering the channel 200.

In order to deal with the excessive cooling which can be generated by the first drain 10, a heating element 250 may be provided. The heating element 250 is a single heating element which is adjacent the inlet 110 and extends around the periphery (e.g., circumference) of the inlet 110.

The heating element 250 may be positioned underneath the chamber 140 or on either side of the chamber 140, as illustrated in FIG. 7. There may be other appropriate positions for the heating element 250.

A fourth temperature sensor 260 is provided. The fourth temperature sensor 260 is provided in the vicinity of the inlet 110. A controller can use the information obtained from the fourth temperature sensor 260 to control the power applied to the heating element 250.

Although the system illustrated in FIG. 8 does alleviate some difficulties, particularly when a localized area liquid supply system is used, the cooling around the periphery of the inlet 110 is not necessarily uniform. Therefore the position of the fourth temperature sensor 260 is significant. If the fourth temperature sensor 260 is in a position which has experienced a large amount of local cooling, then although that cooling may be compensated, other areas of the inlet 110 may be heated too much. The difficulty with sensor 260 means that it may be better to control the heating element 250 based on the temperature difference between the second and third temperature sensors 220 and 230. The controller uses this difference as a measure of the thermal load on the substrate table edge. If on a part of the total periphery of the substrate table a thermal load is applied, the balancing heat load is applied over the total periphery. As a result the heating element undercompensates the loaded area and disturbs the unloaded area. If for instance 1 W is over $\frac{1}{3}^{rd}$ of the substrate table edge, this is compensated with 1 W over the total edge. So, only 0.33 W of that localized load is compensated, the other 0.66 W is disturbing the rest of the edge. Even by the provision of further temperature sensors around the inlet 110, this problem may not be alleviated.

Figure 9:
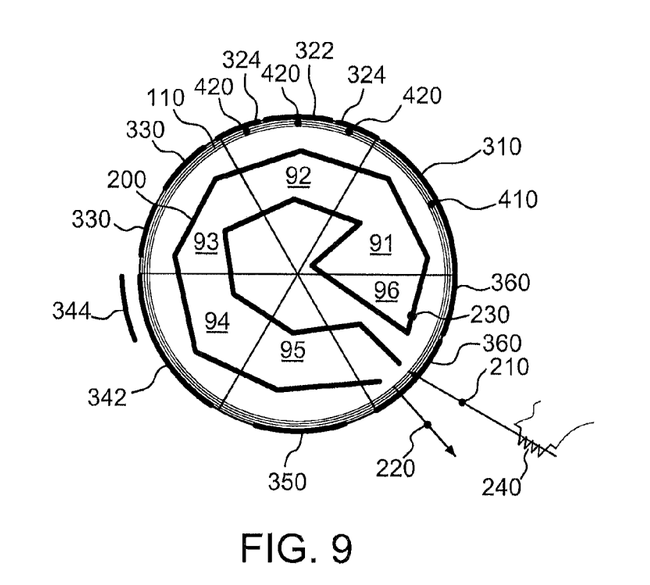
FIG. 9 illustrates, in plan, a central section of a substrate table in accordance with an embodiment of the present invention.

FIG. 9 illustrates an embodiment of the present invention. A plurality of heaters 310, 322, 324, 330, 342, 344, 350, 360 are provided adjacent the inlet 110. At least two of the plurality of heaters 310, 322, 324, 330, 342, 344, 350, 360 are positioned along different segments of an edge of the substrate supporting area. That is, the periphery of the inlet 110 is segmented and each segment has at least one heater 310, 322, 324, 330, 342, 344, 350, 360 associated with it. This can be seen most clearly with reference to FIG. 9 which illustrates in plan the substrate support area just like in FIG. 8. In contrast to FIG. 8, instead of providing a single heating element 250 around the entire periphery of the inlet 110, the periphery of the inlet 110 has been split into six sections or segments. Each section or segment is provided with at least one heater 310, 322, 324, 330, 342, 344, 350, 360. In FIG. 9 for illustration purposes each section is provided with a different combination of heaters 310, 322, 324, 330, 342, 344, 350, 360. However, it will be appreciated that any combination of heaters may be used and indeed all of the sections may have the same heater configuration or only some of the sections may have the same heater configuration.

In the first segment 91, only a single heater 310 is present. The single heater 310 extends along the entire length of the segment 91. In the second segment 92 three heaters 322, 324 are illustrated. The heaters 322, 324 are of the same length and together extend along the entire length of the segment 92.

In the third segment 93, two heaters 330 are provided. These heaters 330 are short heaters and do not cover, even together, the entire length of the third segment 93.

The power of the heaters is chosen closely to match the cooling power of the potential heat load. This may result in the need of a further heater to account for unexpected heat loads. In the fourth segment 94, a heater 342 covers the entire length of the segment 94. A further heater 344 is provided which only covers a small portion of the segment 94. This could be useful, for example, where it is known that localized cooling will occur at a particular part of a segment more frequently than at other parts, in use. The two heaters 342, 344 could be provided at different locations within the substrate table. The position of the heaters in FIG. 9 could be the same as the position of the heating element 250. That is, they could be positioned below the first drain 10 or on either side of it, or elsewhere. In the case of two over lapping heaters such as in the fourth segment 94 of FIG. 9, one heater could be provided to the right hand side of the chamber 140 and the other heater could be provided below the first drain 10 or to the left hand side of the chamber 140.

In FIG. 9 the fifth segment 95 has a single heater 350 which does not extend along the whole length of the segment 95. In the sixth segment 96, two heaters 360 are present which, contrary to what is the case in the third segment 93, do extend along the entire length of the segment 96.

As can be seen, the heaters, as a group, extend substantially around the edge of the substrate supporting area, even though there may be gaps between neighboring heaters. At least two heaters will be non-parallel and this helps ensure that not just portions on opposite sides of the edge of the substrate supporting area have associated heaters (as in, for example, the arrangement of parallel heaters in U.S. Pat. No. 7,304,715).

Each of the heaters are shaped closely to conform, in plan, to the portion of the edge of the substrate supporting area with which they are associated, that is, the heaters are not, in plan, straight, they are curved. Each of the heaters may be elongate in the vertical or horizontal direction as well as elongate peripherally as illustrated in FIG. 9. Any combination of horizontal and vertical heater and/or number of heater(s) and/or location may be used in each segment.

In an embodiment, the plurality of heaters are individually controllable in the sense that at least two of the plurality of heaters are independently controllable of one another. However, it may be the case that two heaters in the same segment are controlled in unison. For example, in the third and sixth segments 93, 96 of FIG. 9, the heaters 330, 360 may be controlled in the same way.

In an embodiment, the control of the heaters is done based on results of temperature sensors positioned within the segment. The precise location of the temperature sensors will be discussed in more detail with reference to FIG. 12. However, as can be seen in FIG. 9, each segment may be provided with a single sensor 410 as is illustrated in the first segment 91. Alternatively or additionally, more than one temperature sensor may be provided per segment. One such example is illustrated in the second segment 92 where there are three temperature sensors 420 positioned along the length of the segment 92. As will be described with relation to FIG. 12, the precise position of the temperature sensors can vary, particularly the height of the temperature sensor within the substrate table and its radial location relative to the components of the first drain 10.

By providing the plurality of heaters which are individually controllable, it is possible to account for local heat variations which are likely when a localized area liquid supply system is used. That is, if the inlet 110 passes under a localized liquid supply system, cooling is only likely to occur along a length of the inlet 110 which passes under the area covered by liquid. With the system of FIG. 9 it is possible to heat only that area and so maintain a more constant temperature of the substrate table WT and thereby reduce overlay errors. By providing the heaters in groups of segments, it is possible carefully to control the local temperature and this will be discussed with reference to FIGS. 10 and 11 below.

A controller may be provided to control the power applied to each of the heaters. The controller may base the amount of power supplied to each heater 310, 322, 324, 330, 342, 344, 350, 360 on signals received from one or more temperature sensors. Alternatively or additionally, power may be applied to the heaters based on the position of the substrate table WT under the liquid handling system. Therefore when the position of the substrate table WT indicates that a heat load may be applied due to the first drain 10 being at a certain location, a heater at that location may be energized to compensate. The controller may be in the form of computer software. The controller may control a plurality of heaters of a single segment as a group or it may control those heaters individually.

Splitting the heaters up into at least three segments around the inlet 110, desirably at least four or at least six different segments, may be advantageous. The ideal number of segments is linked to the width (e.g., diameter) of the localized area of the top surface of the substrate table and/or substrate to which the liquid supply system provides liquid. If each segment has a length of three times or less than the width (e.g., diameter) of the localized area, significant improvements in temperature regulation may be achieved.

If the inlet 110 is connected to the under pressure via a plurality of distinct through holes positioned along the periphery of the inlet 110, then the number of segments in which the heaters are distributed may be an integer multiple of the number of the distinct through holes. For example, if there are 3 distinct through holes then the number of segments may be 3, or 6, or 9, or 12, etc.

Figure 10:
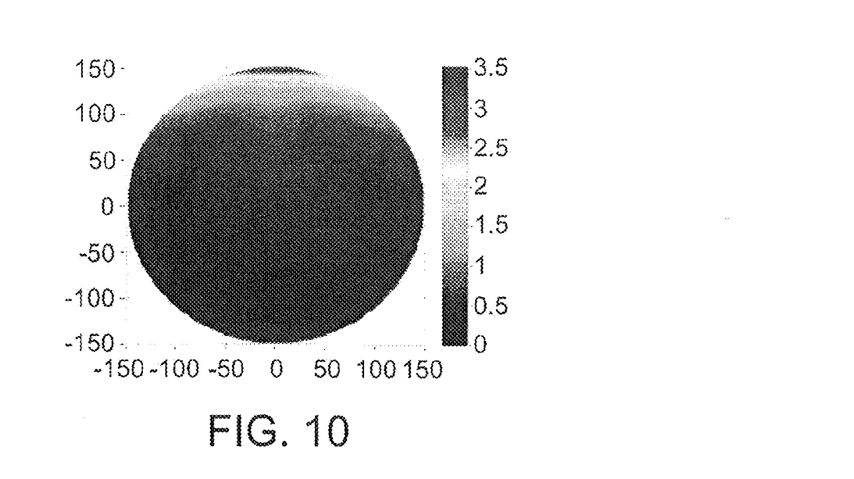
FIG. 10 illustrates the thermal response of the substrate table of FIG. 8.
Figure 11:
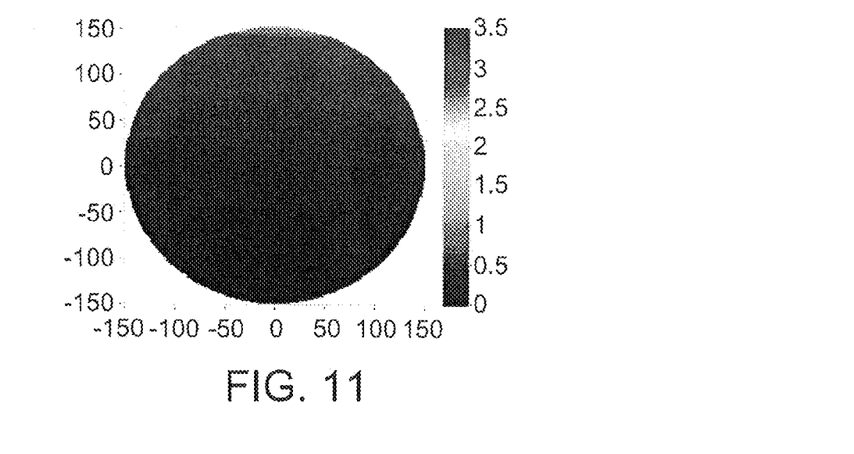
FIG. 11 illustrates a typical thermal response of a substrate table according to an embodiment of the present invention.

FIGS. 10 and 11 show the simulated results of a temperature profile a certain time after the application of a heat load to a substrate table WT according to FIG. 8 and a substrate table according to FIG. 9 respectively. In each case the movement of a localized area liquid supply system from above the substrate support area, as illustrated, onto the substrate W was simulated. A 1 W cooling load was applied over ⅙ of the periphery of the inlet 110. Therefore the first drain 10 experienced liquid penetration only at the top of the inlet 110 when viewed in plan as illustrated. The figures illustrate the temperature profile after a predetermined time following the movement of the localized area liquid supply system onto the substrate W.

As can be seen, the single heating element 250 of FIG. 8 could not compensate for the local heat load. In FIG. 10 a non-uniform heat profile can be seen. The temperature profile would result in non-uniform expansion of approximately 3 nm. In contrast, the segmented heater according to FIG. 9 performs much better. As can be seen from FIG. 11 the area which sees a decrease in temperature is much smaller than in FIG. 10 and the absolute value of temperature variation is much smaller too. The results indicate that the heat load would result in only a 1 nm non-uniform expansion.

The results in FIG. 11 are for a heater which is segmented into six segments. If only three segments are used, the improvement may be significantly less and only an improvement of about twenty percent. However, increasing the number of segments beyond six may not improve the results much beyond the results achieved with six segments. This is because of the relationship between the load non-uniformity and the width of the localized area to which liquid is provided.

Figure 12:
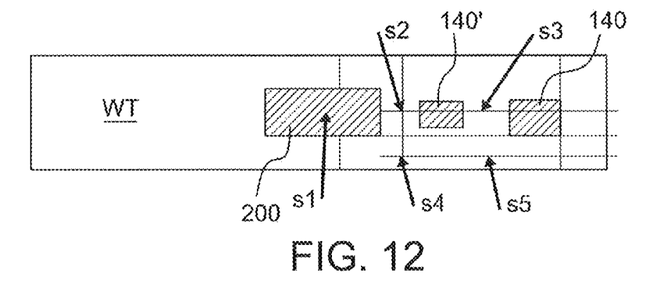
FIG. 12 illustrates, in cross-section, a portion of a substrate table illustrating various positions of temperature sensors.

The precise location of the temperature sensors may have an effect on the achievable control. In the system disclosed in United States Publication No. 2008-0137055, titled "Lithographic Apparatus and Device Manufacturing Method" Published on Jun. 12, 2008, the temperature sensors are placed within the channel 200. This is illustrated as position S1 in FIG. 12. FIG. 12 is a cross-sectional view of a substrate table in the region of the inlet 110. FIG. 12 shows the channel 200 to transport cooling fluid as well as two channels 140 and 140' which are related to the channel of the first drain 10 and a channel of a further drain for removing liquid from underneath the substrate W, respectively. Channel 140' is for the inlet (not illustrated) provided to remove liquid from under the substrate which is referred to above but is not illustrated in FIG. 7. Channel 140 is the channel 140 in the first drain 10 illustrated in FIG. 7. Both of these channels can experience a heat load and this can be compensated for by the segmented heaters.

FIG. 12 shows four other possible positions of a temperature sensor. All of these positions are with the sensor embedded in the material of the substrate table WT. The substrate table WT is typically made of a thermally conductive, low coefficient of thermal expansion material such as SiSiC, Sialon™ (Silicon Aluminium Oxynitride available from Accuratis Corporation, NJ, US) or Cordierite (a magnesium iron aluminium cyclosilicate). The substrate table WT can be made of multiple parts which are bonded together. For example the substrate table WT may be made of an upper part and a lower part. The temperature sensors may be positioned at a join between two such parts thereby to be embedded in the substrate table WT though that is not necessarily the case. Embedding the temperature sensor may provide much better thermal response than positioning a sensor in a channel 200. This is because any heat load applied to the inlet 110 will take time to conduct to the channel 200 and then take time to conduct through the moving heat transfer fluid in the channel to the sensor S1.

Figure 13:
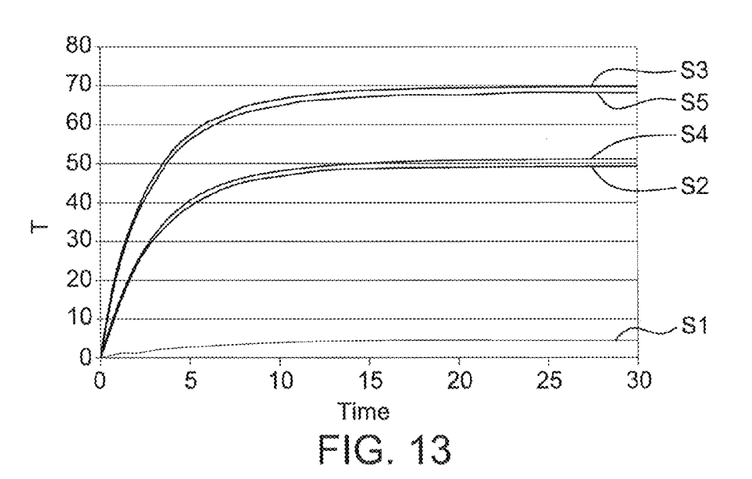
FIG. 13 illustrates the thermal response of the sensors in FIG. 12 when the substrate table is subjected to a thermal shock.

FIG. 13 shows the simulated response of the temperature sensors for an instance where the edge of a substrate W passes under a localized area of a liquid supply system. As can be seen in FIG. 12, sensors S2 and S3 are positioned at the same level as the channels 140, 140'. Sensors S4 and S5 are positioned below that level as shown in FIG. 12. As can be seen in FIG. 13, the response of sensors S3 and S5 is fastest (because they are closest to the first drain 10). The next fastest response is of sensors S2 and S4 because they are closer to the drains than the sensor S1. The response of sensor S1 hardly registers the change in temperature and control using this sensor would be problematical. It may be desirable for the temperature sensors of each segment to be positioned within 5 mm of the first drain 10, i.e. the inlet 110 and/or any passage or chamber of the drain.

The position of the heaters is chosen according to the exact design of the substrate table. For example, it may be known that one particular part of the drain experiences a higher heat load during passing of the localized area over an edge of the substrate than other areas. In that case, at least one heater can be placed close to that area with optionally other heaters present elsewhere.

The temperature sensors could be point sensors in which case it is likely that more than one temperature sensor per segment will be needed. For any particular arrangement of heaters, the thermal response may be better if the response is controlled by the signal from three temperature sensors in a segment rather than just one temperature sensor. An average of the sensors should be taken. The sensors may be connected in parallel or in series but this does not really affect their performance. Either way will give an average of the temperature measurement. Alternatively the temperature sensors could be a ribbon sensor which by its nature averages the temperature over an area. The sensor could, for example, be a NTC sensor (that is a negative temperature co-efficient sensor) which is surface mounted.

A controller is provided. The controller attempts to maintain the measured temperature at a given set point. The faster the response the better the performance which can be expected. The faster the thermal time constants, the smaller the net maximum temperature change which will occur on the application of a heat load. The controller may control the heaters based on feedback from sensors in the segment as well as optionally at least one of sensors 220, 230, 260. Feed forward control is possible based on the position of the liquid handling system.

Although an embodiment of the present invention has been described above with reference to an immersion lithographic apparatus, this need not necessarily be the case. Other types of lithographic apparatus may suffer from uneven cooling (or heating) around the edge of a substrate. For example, in an EUV apparatus (extreme ultra-violet apparatus) heating due to the impingement of the projection beam can occur. This can give a localized heating to the substrate rather in the same way as the passage of the edge of substrate under the localized liquid supply system can give a cooling effect. If the heat transfer fluid in the channel 200 is given a small negative temperature offset with respect to the desired temperature in a normal operating condition, all the heaters can be on to obtain the desired temperature. A local cooling load can then be applied by switching a heater off. In this circumstance it may be that the localization of the heaters only at the edge of the substrate is too limited and that heaters may be additionally or alternatively be placed at different radial distances from the center of the substrate supporting area. However, the same principles as described above apply in this case also.

Therefore, as can be seen, an embodiment of the present invention can be implemented in many types of immersion lithographic apparatus. For example, an embodiment of the invention may be implemented in an I-line lithographic apparatus.

In an aspect, there is provided a lithographic projection apparatus comprising a substrate table configured to support a substrate on a substrate supporting area, the substrate table comprising a plurality of heaters, at least two of the plurality of heaters being positioned in a non-parallel way adjacent different portions of an edge of the substrate supporting area and being independently controllable of one another. Optionally, the plurality of heaters are positioned such that as a group they extend substantially around an edge of the substrate supporting area. Optionally, the at least two of the plurality of heaters are, in plan, curved, desirably curved to follow the shape of the edge. Optionally, at least two of the plurality of heaters are positioned along different segments of the edge of the substrate supporting area. Desirably, there are at least three segments, desirably at least four or at least six different segments. Desirably, the apparatus further comprises a liquid handling system configured to provide a liquid to a localized area of the top surface of the substrate table and/or substrate, and wherein at least one of the segments has a length of three times or less than the width of the localized area. Desirably, the lithographic apparatus further comprises a plurality of temperature sensors, each of the segments being associated with at least one of the plurality of temperature sensors. Optionally, the lithographic apparatus further comprises a plurality of temperature sensors in the substrate table. Desirably, at least one of the plurality of temperature sensors is embedded in material of the substrate table. Desirably, at least one of the plurality of temperature sensors is associated with each of the plurality of heaters. Optionally, the lithographic apparatus further comprises an inlet for fluid in the substrate table, the inlet being provided around and radially outwardly of the substrate supporting area. Desirably, the plurality of heaters are positioned radially outwardly of the inlet. Desirably, the lithographic apparatus further comprises a temperature sensor, the temperature sensor being positioned within 5 mm of the inlet and/or any passage or chamber in fluid communication with the inlet. Optionally, the plurality of heaters comprise both heaters extending in the vertical direction and heaters extending in the horizontal direction. Optionally, the lithographic apparatus further comprises a controller configured to provide power to the plurality of heaters. Desirably, the controller is configured to control power provided to the plurality of heaters based on feedback based on a temperature measured by a temperature sensor. Desirably, the controller is configured to control power provided to the plurality of heaters based on feedforward control. Optionally, the lithographic projection apparatus further comprises a further heater configured to heat a central section of the substrate supporting area. Desirably, the further heater comprises a channel for the flow therethrough of a heat transfer fluid. Optionally, the lithographic apparatus is an immersion lithographic apparatus.

In an aspect, there is provided a lithographic apparatus comprising a substrate table configured to support a substrate on a substrate supporting area, an inlet in the substrate table, the inlet surrounding the substrate supporting area, and a plurality of heaters positioned adjacent to an edge of the inlet, wherein at least two of the plurality of heaters are positioned along different segments of the inlet. Optionally, the lithographic apparatus further comprises a liquid handling system configured to provide a liquid to a localized area of the top surface of the substrate table and/or substrate, and wherein at least one of the segments has a length of three times or less than the width of the localized area. Optionally, the lithographic apparatus further comprises a controller configured to control power applied to the plurality of heaters. Desirably, the controller is configured to apply power to the heater(s) of each segment individually. Desirably, the controller is configured to apply power to the heater(s) of each segment individually based on a temperature sensed local to a respective segment. Optionally, there are at least three different segments. Optionally, the plurality of heaters are curved, in plan, substantially to conform in shape to the inlet. Optionally, the plurality of heaters are non-parallel. Optionally, the inlet is connected to an underpressure via a plurality of through holes which extend around the substrate supporting area. Desirably, the lithographic apparatus comprises a number of different segments which is an integer multiple of the number of the through holes. Optionally, the lithographic apparatus further comprises an inlet for fluid in the substrate table, the inlet being around and radially outwardly of the substrate supporting area. Desirably, the plurality of heaters are positioned radially outwardly of the inlet. Desirably, the lithographic apparatus further comprises a temperature sensor, the temperature sensor positioned within 5 mm of the inlet and/or any passage or chamber in fluid communication with the inlet. Optionally, the plurality of heaters comprise both heaters extending in the vertical direction and heaters extending in the horizontal direction. Optionally, the lithographic apparatus further comprises a plurality of temperature sensors in the substrate table. Desirably, the plurality of temperature sensors are embedded in material of the substrate table. Desirably, a plurality of the plurality of temperature sensors is associated with each of the plurality of heaters. Optionally, the lithographic apparatus is an immersion lithographic apparatus.

In an aspect, there is provided a method of compensating for a local heat load in an immersion lithographic projection apparatus comprising a substrate table configured to support a substrate on a substrate supporting area, the method comprising controlling a plurality of independently controlled non-parallel heaters adjacent different portions of an edge of the substrate supporting area to compensate for a local heat load.

In an aspect, there is provided a method of compensating for a local heat load variation in an inlet which surrounds a substrate supporting area of a substrate table of a lithographic apparatus, the method comprising controlling power to each of a plurality of heaters positioned adjacent an edge of the inlet, wherein at least two of the plurality of heaters are positioned along different segments of the inlet, to compensate for a local variation in temperature.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus comprising:
   a substrate table configured to support a substrate on a substrate supporting area;
   an inlet for a liquid in the substrate table, the inlet surrounding the substrate supporting area;
   a plurality of heaters positioned adjacent to an edge of the inlet, at least two of the plurality of heaters positioned in a non-parallel way to each other, positioned respectively adjacent different portions of an edge of the substrate supporting area and being independently controllable of one another;
   a liquid handling system configured to provide the liquid to a localized area of a top surface of the substrate table and/or the substrate; and
   a projection system to project a radiation beam through the liquid in the localized area onto the substrate.

2. The lithographic apparatus of claim 1, wherein the plurality of heaters are positioned such that as a group they extend substantially around an edge of the substrate supporting area.

3. The lithographic apparatus of claim 1, wherein the at least two of the plurality of heaters are, in plan, curved.

4. The lithographic apparatus of claim 1, wherein at least two of the plurality of heaters are positioned along different segments of the edge of the substrate supporting area.

5. The lithographic apparatus of claim 4, wherein the different segments are at least three segments.

6. The lithographic apparatus of claim 4, wherein at least one of the segments has a length of three times or less than the width of the localized area.

7. The lithographic apparatus of claim 4, further comprising a plurality of temperature sensors, each of the segments being associated with at least one of the plurality of temperature sensors.

8. The lithographic apparatus of claim 1, further comprising a plurality of temperature sensors in the substrate table, wherein at least one of the plurality of temperature sensors is embedded in material of the substrate table.

9. The lithographic apparatus of claim 1, further comprising a plurality of temperature sensors in the substrate table, wherein at least one of the plurality of temperature sensors is associated with each of the plurality of heaters.

10. The lithographic apparatus of claim 1, wherein the plurality of heaters are positioned radially outwardly of the inlet.

11. The lithographic apparatus of claim 1, further comprising a temperature sensor, the temperature sensor being positioned within 5 mm of the inlet and/or any passage or chamber in fluid communication with the inlet.

12. The lithographic apparatus of claim 1, wherein the plurality of heaters comprise both heaters extending in the vertical direction and heaters extending in the horizontal direction.

13. The lithographic apparatus of claim 1, further comprising a controller configured to control power provided to the plurality of heaters based on feedback based on a temperature measured by a temperature sensor.

14. The lithographic apparatus of claim 1, further comprising a controller configured to control power provided to the plurality of heaters based on feedforward control.

15. The lithographic apparatus of claim 1, further comprising a further heater configured to heat a central section of the substrate supporting area.

16. The lithographic apparatus of claim 15, wherein the further heater comprises a channel for the flow therethrough of a heat transfer fluid.

17. A method of compensating for a local heat load in an immersion lithographic projection apparatus comprising a substrate table configured to support a substrate on a substrate supporting area, wherein the substrate table has an inlet for a liquid and the inlet surrounds the substrate supporting area, the method comprising:

controlling a plurality of independently controlled heaters positioned non-parallel to each other, positioned respectively adjacent different portions of an edge of the substrate supporting area and positioned adjacent to an edge of the inlet, to compensate for a local heat load;

providing the liquid to a localized area of a top surface of the substrate table and/or the substrate; and projecting a radiation beam through the liquid in the localized area onto the substrate.

18. A lithographic apparatus comprising:

a substrate table configured to support a substrate on a substrate supporting area;

an inlet in the substrate table, the inlet surrounding the substrate supporting area; and a plurality of heaters positioned adjacent to an edge of the inlet, wherein at least two of the plurality of heaters are non-parallel to each other and respectively positioned along different segments of the inlet.

19. The lithographic apparatus of claim 18, wherein the at least two of the plurality of heaters are, in plan, curved.

20. A method of compensating for a local heat load variation in an inlet which surrounds a substrate supporting area of a substrate table of a lithographic apparatus, the method comprising:

controlling power to each of a plurality of heaters positioned adjacent an edge of the inlet, wherein at least two of the plurality of heaters are non-parallel to each other and respectively positioned along different segments of the inlet, to compensate for a local variation in temperature.

* * * * *